United States Patent [19]

Nishizawa et al.

[11] 4,377,817
[45] Mar. 22, 1983

[54] SEMICONDUCTOR IMAGE SENSORS

[75] Inventors: Jun-ichi Nishizawa; Tadahiro Ohmi, both of Sendai, Japan

[73] Assignee: Semiconductor Research Foundation, Japan

[21] Appl. No.: 130,775

[22] Filed: Mar. 17, 1980

[30] Foreign Application Priority Data

Mar. 19, 1979 [JP] Japan ............................. 54-33024

[51] Int. Cl.³ ........................................ H01L 29/80
[52] U.S. Cl. ................................... 357/22; 357/41; 357/30
[58] Field of Search ............................ 357/22, 41, 30

[56] References Cited

U.S. PATENT DOCUMENTS 4,284,997 8/1981 Nishizawa ........................... 357/22

Primary Examiner—Martin H. Edlow
Attorney, Agent, or Firm—McGlew and Tuttle

[57] ABSTRACT

This invention relates to a semiconductor image sensors and more particularly, to a back-illuminated-type static induction transistor image sensors.

FIGS. 4A to 4C show the back illuminated type SIT image sensors operating in the electron depletion storing mode, where the n+buried floating region 23 serves as storage region.

10 Claims, 21 Drawing Figures

SEMICONDUCTOR IMAGE SENSORS

This invention relates to a semiconductor image sensors and, more particularly, to a back-illuminated-type static induction transistor image sensors.

Charge coupled imager (CCI) is one of the representatives of solid state image sensors. In CCI, stored charges are transferred sequentially succeeding devices, so that the speed performance is poor, and the dynamic range is liable to be narrow and is very sensitive to the existence of crystal imperfection. One of the inventors of this invention has already presented static induction transistor memory (SITM, Static Induction Transistor Image Sensors). One of the source region and the drain region of static induction transistor (SIT) is set as a floating region, thus realizing dynamic RAM cell (SIT memory). Cell size of SIT memory is almost equal to that of single SIT, so that packing density of SIT memory becomes very high. A schematic cross-sectional view and circuit diagram of one example of SIT memory cell are shown in FIG. 1A and FIG. 1B. Reference numeral 11 designates a semiconductor substrate of a first conductivity, for example, a p-type silicon substrate with relatively high resistivity. Single memory cell is realized in the region surrounded by the insulating isolation region 19 such as silicon dioxide ($SiO_2$). An n+ region 12, and n+ region 14 and p+ region 15 serve as a drain region, a source region and a gate region of vertically configured SIT, respectively. An n− high resistivity 13 region serves as a channel region of the vertically configured SIT. An electrode 15' is made of low resistivity polycrystalline silicon. Molybdenum(Mo), tungsten(W), aluminum(Al), titanium silicide($TiSi_2$), tantalum silicide($TaSi_2$), tungsten silicide($WSi_2$) or molybdenum silicide($MoSi_2$) may also be employed for the electrode 15'. The electrode 15' serves as a word line (WL). An electrode 14', an insulating layer 18 and a grounded electrode 20 constitute a storage capacitor C to be used as a memory capacitor for storing information therein. The electrode 14' is made of the low resistivity polycrystalline silicon or tantalum silicide. The grounded electrode 20 is made of metals such as Al, Mo or Tungsten. The insulating layer 18 is a silicon dioxide layer or tantalum oxide($Ta_2O_5$) layer, and has a thickness of 100–1,000 Å in order to increase the storage capacitor. The insulating layers 16 and 17 are made of a single layer of $SiO_2$, silicon nitride($Si_3N_4$), aluminum oxide($Al_2O_3$) or aluminum nitride(AlN), or a combination of these layers. The n+ region 12 serves as a bit line (BL).

When a certain reverse bias voltage (the negative bias voltage in this case) is applied on the word line, the channel region is completely pinched-off by this reverse bias voltage, thus establishing a potential barrier in the channel. On the other hand, when the word line is set at the zero gate bias condition, there appears mobile carriers (electrons in this case) in the channel, thus establishing the conducting state (the one state). When the positive voltage Vo is applied on the bit line in this situation, electrons in the n+ region 14 flow into the bit line and the n+ region 14 is positively biased, thus storing the positive voltage Vo in the storage capacitor. In this operation, the shortage of electrons in the n+ region 14 is stored, so that this operation is called the carrier depletion storing mode. In this carrier depletion storing mode, the reverse bias voltage between the n+ floating region 14 and the p+ gate region 15 increases with increasing the positive bias voltage Vo(the write-in voltage).

On the contrary, excess electrons can be stored in the n+ floating region. This operation is called the carrier accumulation storing mode.

FIG. 1A illustrates SIT memory with a floating storage region set at the surface of the substrate. It is obvious that SIT memory is also realized by the structure having a floating storage region buried in the substrate.

Temperature dependence of memory retention characteristics of these SIT memories is observed in both operational modes and illustrated for the carrier depletion storing mode in FIG. 2 and the carrier accumulating storing mode in FIG. 3, where the read-out voltage $\Delta V_R$ is plotted as a function of retention time $T_{ST}$ for three temperatures of 23° C., 50° C. and 75° C. The dc reverse gate bias voltage $V_{GG}$ is −6 V and the write-in voltage is 4 V. According to FIG. 2, the memory retention line is 10 sec at room temperature in the carrier depletion storing mode, which is reduced to 1.7 sec at 50° C. and 300 msec at 75° C. On the contrary, it is seen from FIG. 3 that the retention time is 1 sec at room temperature in the carrier accumulation storing mode which is decreased to 200 msec at 50° C. and 30 msec at 75° C. In the carrier depletion storing mode, memory retention characteristics are insensitive to temperature variation within the measured temperature range up to 100 msec. The magnitude of the read-out voltage is found almost constant for the temperature variation in the carrier depletion storing mode, while it changes for the temperature variation in the carrier accumulation storing mode. Moreover, the read-out voltage continuously decreases with increasing the retention time in the carrier accumulation storing mode, although the dc gate bias voltage is the same to that in the carrier depletion storing mode. This tendency seems to stem from the fact that the effective potential barrier height is lower in the carrier accumulation storing mode than in the carrier depletion storing mode. In the carrier accumulation storing mode, the increase of the amount of the accumulated electrons in the n+ floating region decreases effectively the reverse bias voltage between the p+ gate region and the n+ floating region. On the other hand, the increase of the amount of the depleted electrons in the n+ floating region inevitably accompanies the effective increase of the reverse bias voltage between them. It is clearly understood that the write-in voltage higher than the dc reverse gate voltage is impossible to be stored in the carrier accumulation storing mode.

As described above, the carrier depletion storing mode is superior to the carrier accumulation storing mode in the memory performances such as the retention characteristics, the temperature dependence of memory retention characteristics and the operational tolerance.

SIT memory cell, particularly operating in the carrier depletion storing mode, is capable of storing analogue information as well as binary digital information. Moreover, excellent performance as the linearity in SIT increases the dynamic range of analog operation of SIT memory. The stored voltage in the storage capacitor is almost equal to the write-in voltage in the SIT memory, which has been demonstrated experimentally to be stored without decaying within the holding time longer than 10 sect at room temperature in the carrier depletion storing mode. Variation of stored level has also been proved to be suppressed within 5% for the variation of temperature from 23° C. to 75° C. The excellent linear relation between the read-out voltage and the write-in voltage in the SIT memory has been demonstrated experimentally, which originates from the non-saturating current-voltage characteristic in SIT.

Accordingly, an object of the present invention is to provide a semiconductor image sensor in which SIT serves as a read-out transistor or a refresh transistor.

The present invention may be briefly summarized as involving a back-illuminated-type semiconductor image sensor comprizing: a photosensitive region where there exists an intense electric field in order to flow created carriers due to the optical input into the floating region and at least one read-out transistor.

Other features and objects of the present invention will be apparent from the following description taken in connection with the accompanying drawings, in which:

DETAILED DESCRIPTION OF THE PREFERRED EMBODIMENTS

Figure 1A:
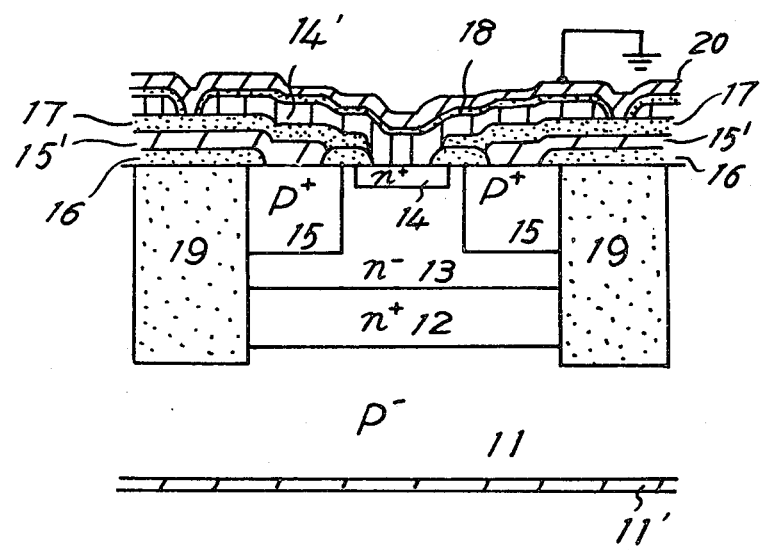
FIG. 1A shows a cross-sectional view of a static induction transistor memory.
Figure 1B:
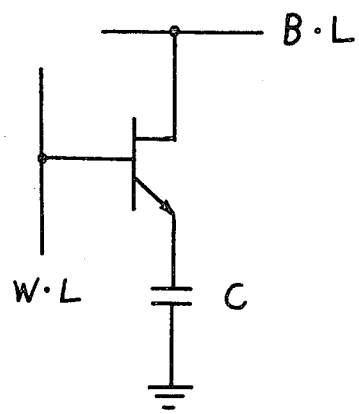
FIG. 1B shows a circuit configuration of a static induction transistor memory shown in FIG. 1A.
Figure 2:
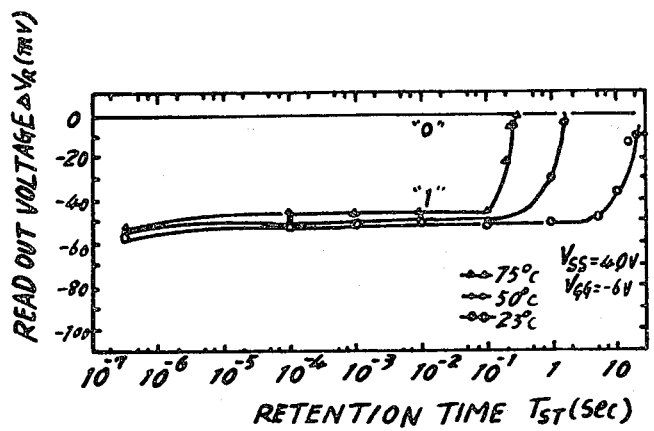
FIG. 2 shows a temperature dependence of memory retention characteristics of SIT memory operating in the carrier depletion storing mode.
Figure 3:
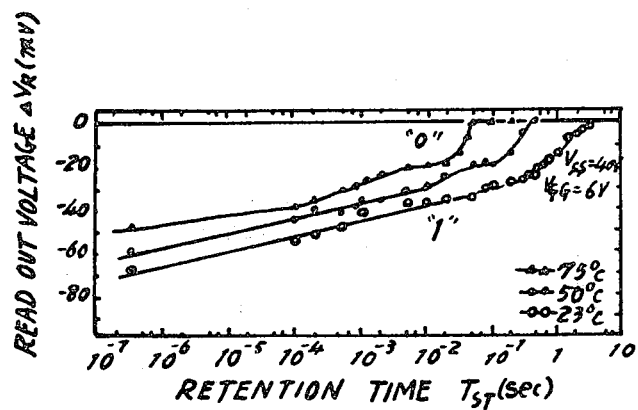
FIG. 3 shows a temperature dependence of memory retention characteristics of SIT memory in the carrier accumulation storing mode.
Figure 4A:
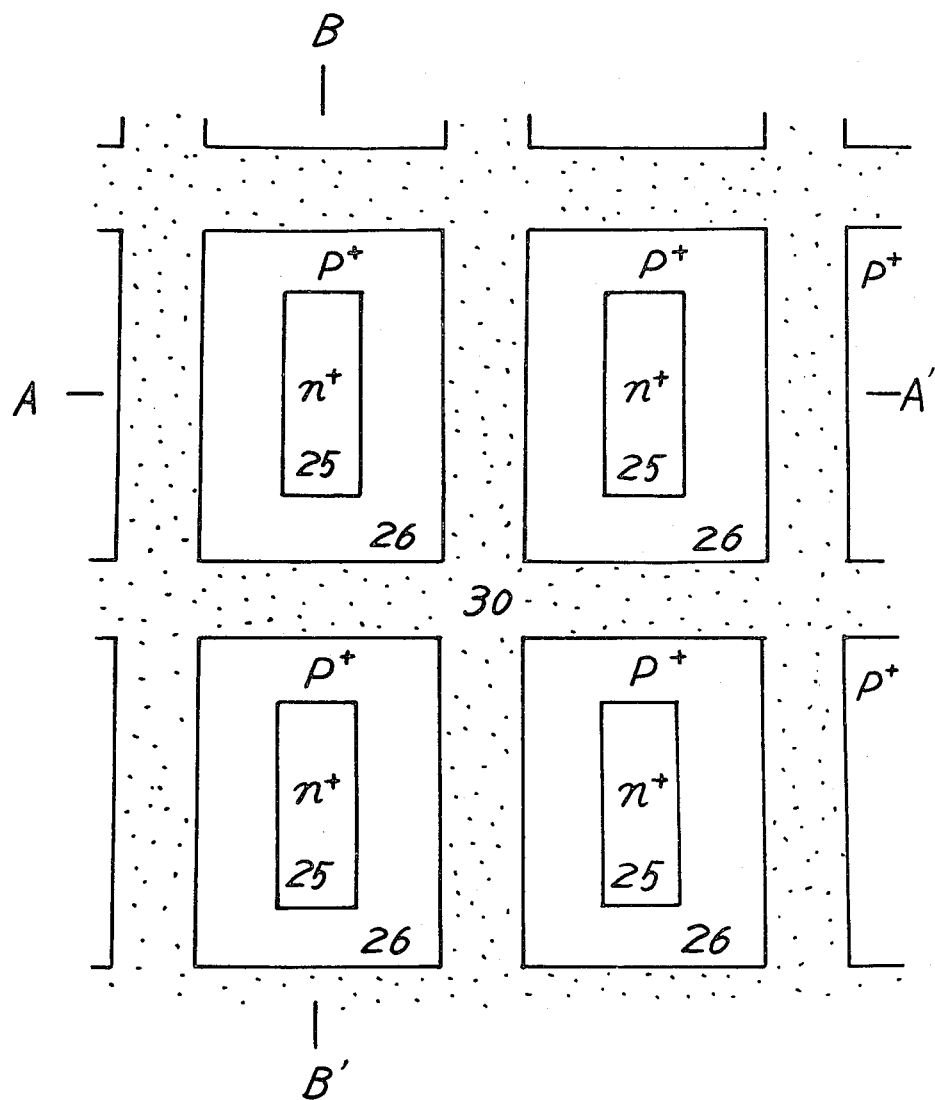
FIG. 4A illustrates a plan view of a portion of a semiconductor image sensor according to the present invention.
Figure 4B:
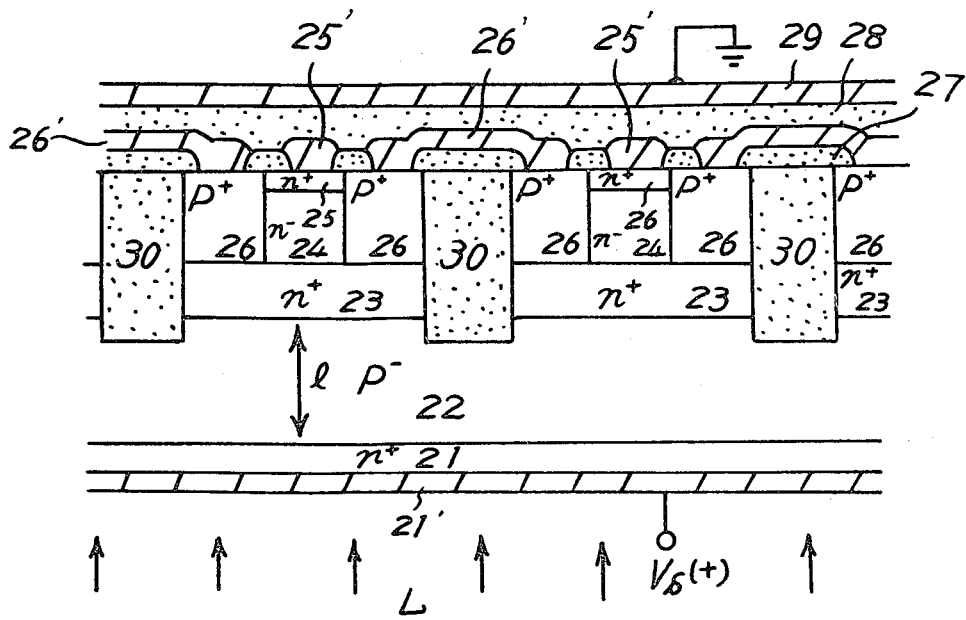
FIG. 4B illustrates a cross-sectional view of the semiconductor image sensor shown in FIG. 4A, taken along the section line A—A.
Figure 4C:
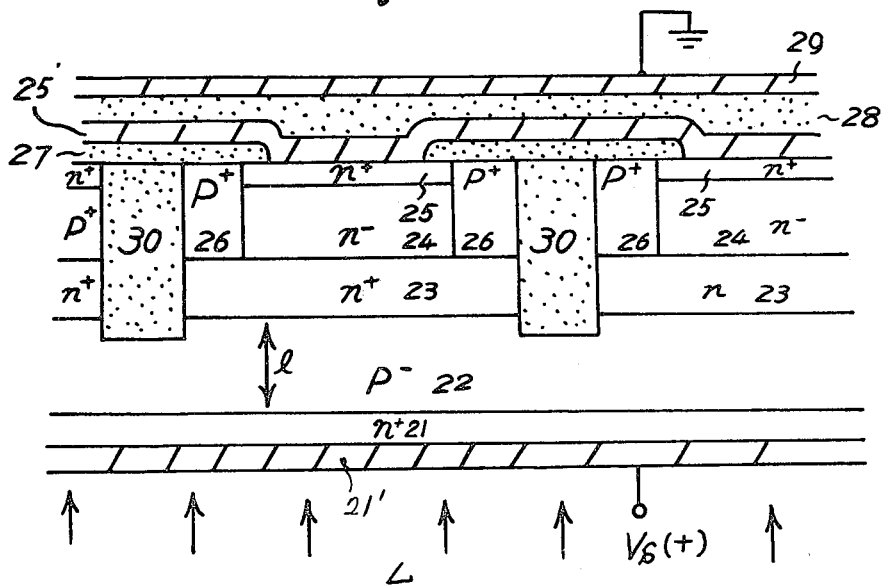
FIG. 4C illustrates a cross-sectional view of the semiconductor image sensor shown in FIG. 4A, taken along the section line B—B'.

In FIG. 4A to 4C, reference numeral 22 designates a semiconductor substrate of a first conductivity type, for example, a p-type silicon substrate with high resistivity. Single memory cell transistor is realized in the region surrounded by the insulating isolation region 30 such as $SiO_2$. An $n^+$ region 23, an $n^+$ region 25 and $p^+$ region 26 serve as a drain region, a source region and a gate region of the vertically configured SIT. An $n^-$ region 24 serves as a channel region of the static induction transistor. An electrode 25 is made of low resistivity polycrystaline silicon. Mo, W, Al, $TiS_2$, $TaSi_2$, $WSi_2$, or $MoSi_2$ may also be employed for the electrode 25'. The electrode 25' serves as a bit line (BL). An electrode 26' is made of same material and serves as a word line (WL). The insulating layer is made of a single layer of $SiO_2$, $Si_3N_4$, $Al_2O_3$ or AlN, or a combination of these layers. The insulating layer 28 is made of $SiO_2$ or polyimide. 29 is a grounded electrode made of Al or other metals. An $n^+$ region 21, a $p^-$ region 22 and an $n^+$ region 23 constitutes an optical sensing region provided with positive applied voltage $V_S(+)$. An electrode 21' is made of transparent material such as indium oxide($In_2O_3$), tin oxide($SnO_2$) and low resistivity polycrystaline silicon. The thickness of the $n^+$ region 21 is set much less than the penetration depth of an optical input.

Figure 4D:
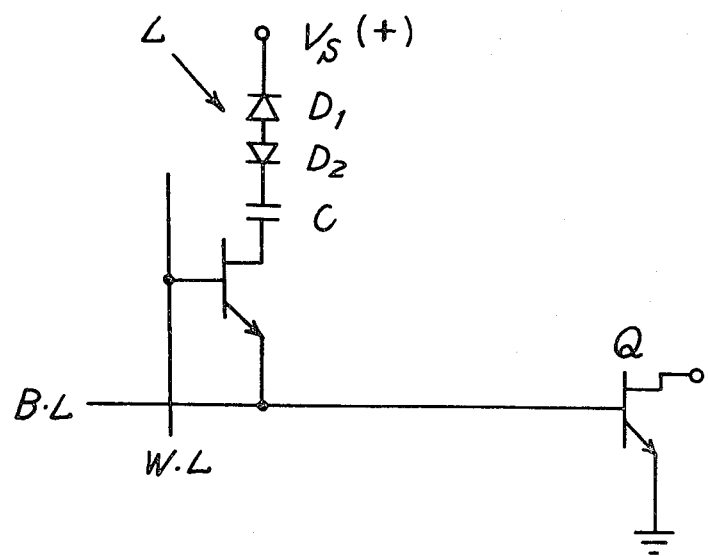
FIG. 4D shows a circuit diagram of the semiconductor image sensor shown in FIG. 4A.
Figures 4E, 4F:
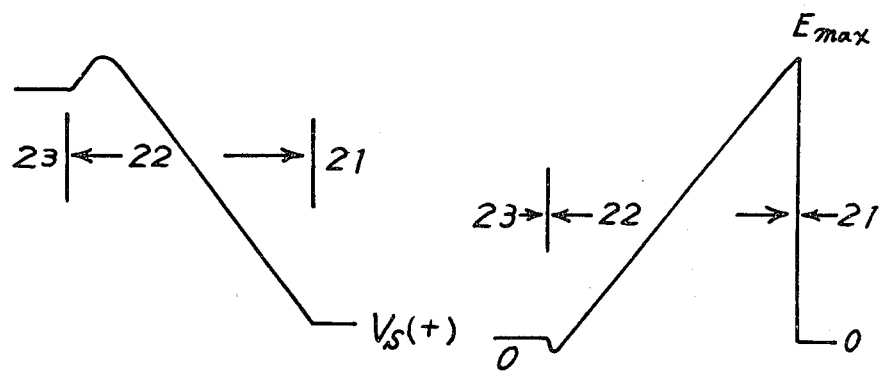
FIG. 4E shows a potential distribution in the photosensitive region of the semiconductor image sensor shown in FIG. 4A.
FIG. 4F shows an electric field intensity distribution in the photosensitive region of the semiconductor image sensor shown in FIG. 4A.

FIGS. 4A to 4C show the back illuminated type SIT image sensors operating in the electron depletion storing mode, where the $n^+$ buried floating region 23 serves as storage region. The circuit configuration of the unit cell shown in FIGS. 4A to 4C is shown in FIG. 4D, where the bit line is connected to the surface $n^+$ region 25 and the word line is connected to the $p^+$ gate region 26. The optical sensing region is represented by two diodes $D_1$ and $D_2$. Potential profile and field intensity profile in the $n^+(21)p^-(22)n^+(23)$ optical sensing region provided with positive applied voltage $V_S(+)$ are shown in FIGS. 4E and 4F, respectively. Optical irradiation through the transparent electrode, where the positive voltage $V_S(+)$ is applied, generates electron-hole pairs in the $p^-$ region 22. Generated holes are flowing towards the $n^+$ buried region 23 and stored in the $n^+p^-$ junction adjacent to the $n^+$ buried region 23. The stored holes lower the potential barrier height for electrons in the $n^+$ buried region 23, resulting in flowing out of electrons from the $n^+$ buried region 23 towards the transparent electrode.

The increase of stored holes in the $n^+p^-$ junction increases the amount of flowing out electrons from the $n^+$ buried region 23 due to the lowering of the $n^+p^-$ junction potential, so that $n^+$ buried region 23 is depleted and tends to exhibit positive potential. Electron-hole pairs are created in the $p^-$ region 22 near the transparent electrode and holes are accelerated towards the $n^+$ buried region 23 by the intense electric field such as shown in FIG. 4E, so that the optical sensing layer ($p^-$)

thickness l can be designed to become thicker than the optical penetration depth. However, the field intensity profile is usually triangle in the n+p−n+ structure, so that the carrier drift velocity decreases gradually towards the n+ buried region 23 and the carrier transit time tends to become longer.

In the read-out process, the reverse gate bias voltage applied on the p+ gate region returns to 0 V. Read-out process is finished by the electrons in the surface n+ region 25 flowing into the positively self-biased n+ buried region 23 through the channel 24. The stored voltage proportional to the optical input is detected through the sense amplifier transistor Q.

Figure 5A:
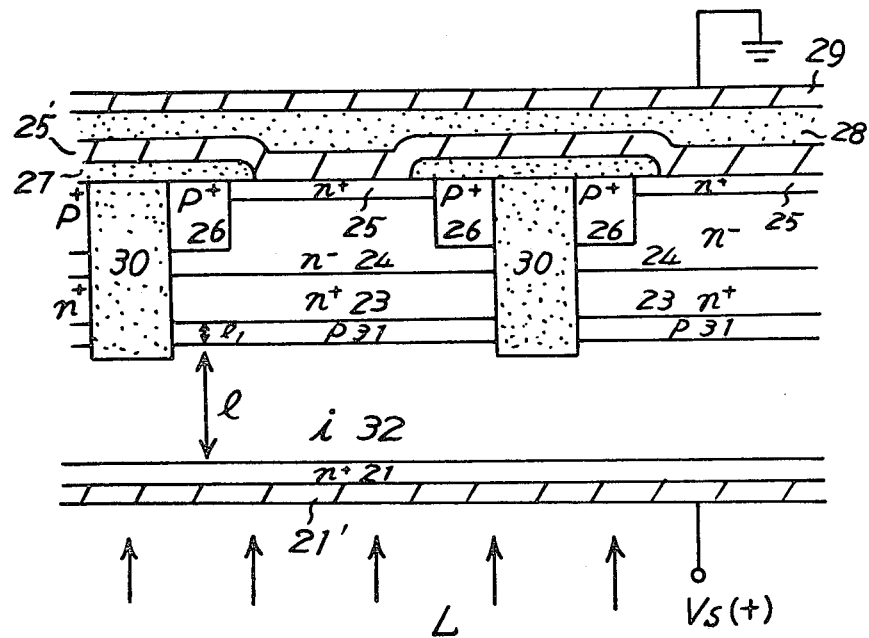
FIG. 5A shows a cross-sectional view of the other embodiment of the semiconductor image sensor according to the present invention.
Figures 5B, 5C:
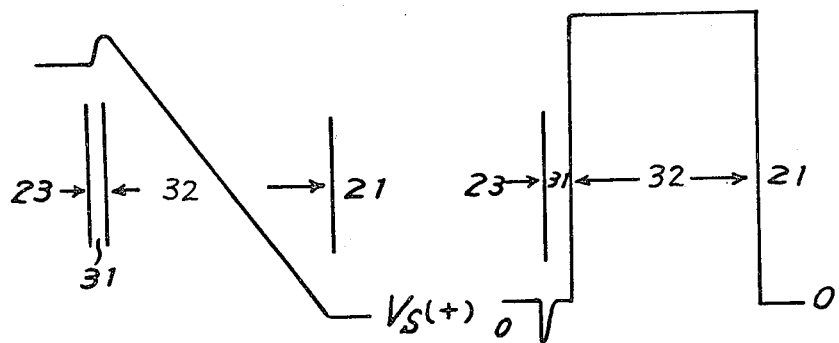
FIG. 5B shows a potential distribution in the photosensitive region of the semiconductor image sensor shown in FIG. 5A.
FIG. 5C shows an electric field intensity distribution in the photosensitive region of the semiconductor image sensor shown in FIG. 5A.

Another embodiment of the present invention is given in FIG. 5A, where the p− region 22 in FIGS. 4B and 4C is replaced by the substantially intrinsic i region 32 as shown in FIG. 5A. A floating p region 31 is introduced adjacent to the floating n+ region in this embodiment. Potential profile and field intensity profile in the n+(21)i(32)p(31)n+(23) image sensing region are also illustrated in FIG. 5B and FIG. 5C. In this embodiment, the field intensity profile is substantially uniform in the substantially intrinsic region 32, so that carrier drift velocity does not decrease even near to the p-i contact and the carrier transit time is very short. Thus the hole storing process is very effective in this sample. Moreover, the thickness of the substantially intrinsic region can be made longer in this embodiment compared to that in the embodiment illustrated in FIG. 4. Electron depleting process from the n+ buried region 23 and the read-out process are quite similar to those in the embodiment of FIG. 4.

In order to increase the dynamic range of linearity, the supply voltage $V_S$ is desired as high as possible in this embodiment.

Figure 6A:
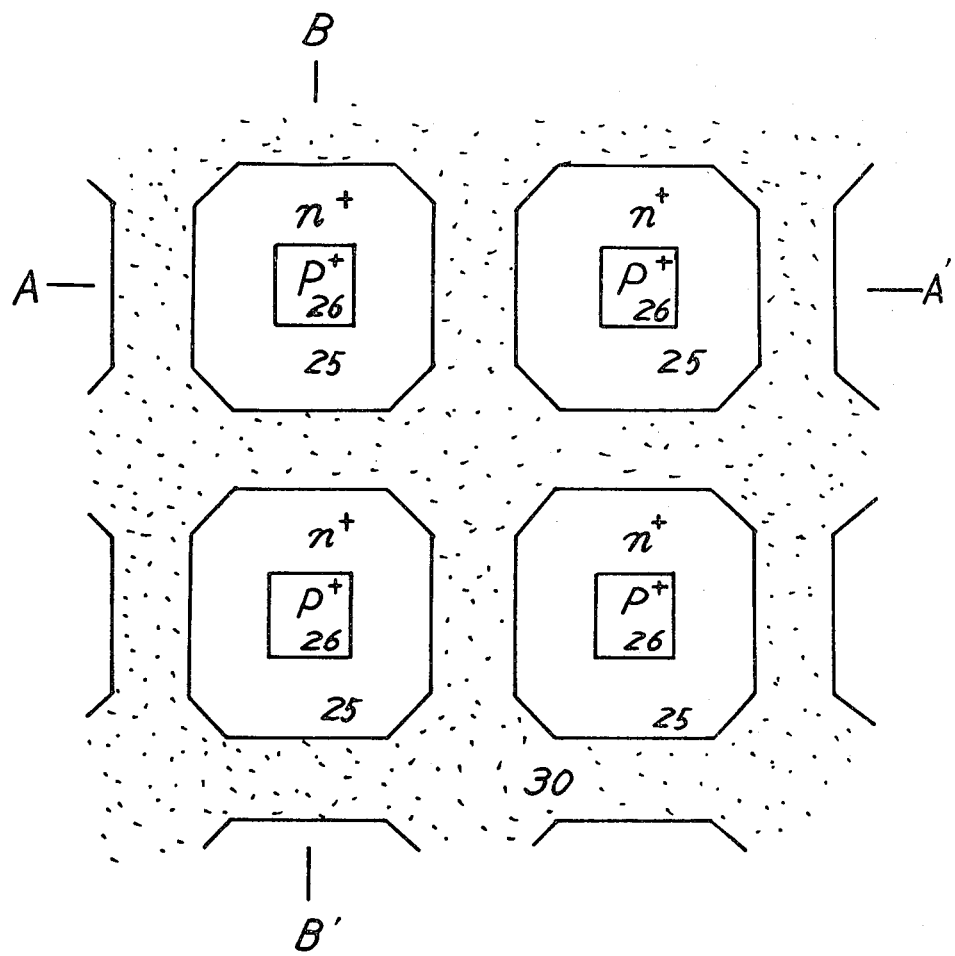
FIG. 6A shows a plan view of a portion of the other embodiment of the semiconductor image sensor according to the present invention.
Figure 6B:
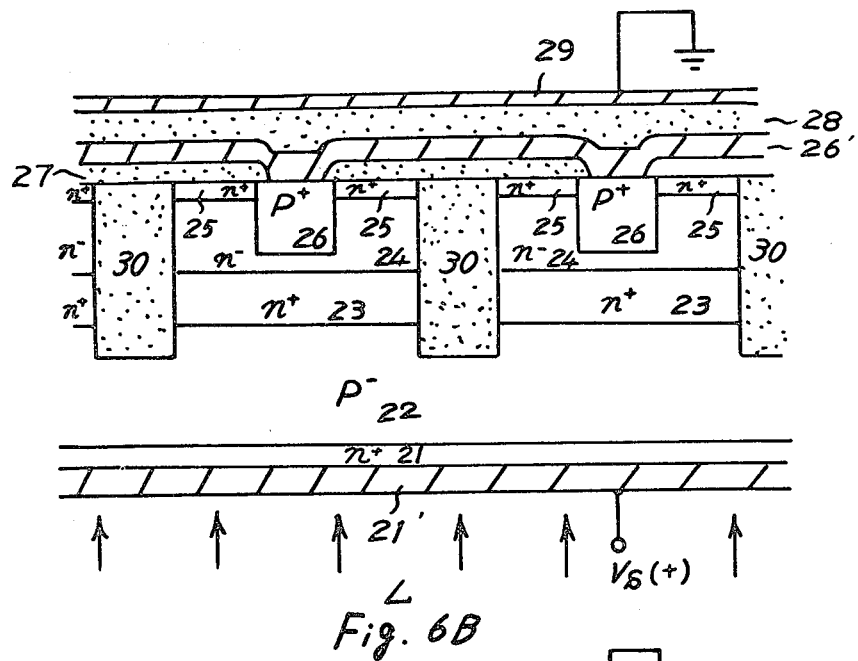
FIG. 6B shows a cross-sectional view of the semiconductor image sensor shown in FIG. 6A, taken along the section line A—A'.
Figure 6C:
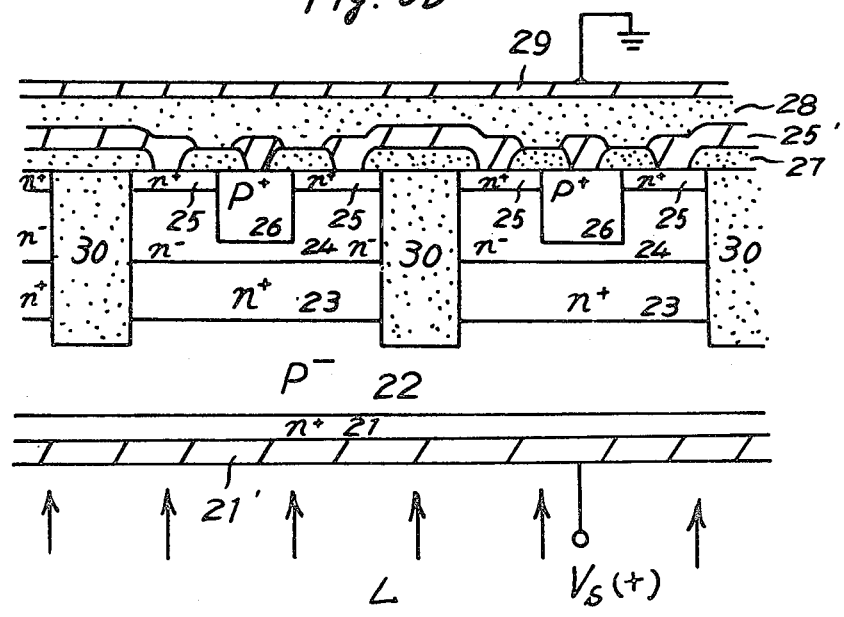
FIG. 6C shows a cross-sectional view of the semiconductor image sensor shown in FIG. 6A, taken along the section line B—B'.

Another embodiment of the present invention is shown in FIGS. 6A to 6C, where the optical sensing structure is similar to that of the embodiment shown in FIGS. 4A to 4C. However, the p+ gate region 26 is set at the center of the read-out transistor in this embodiment as shown in FIGS. 6A to 6C. Optical sensing process and read-out process is quite similar to those in the embodiment shown in FIG. 4.

Electron depletion storing mode semiconductor image sensors are described so far, where the stored holes in the n+(23)p−(22) junction in FIGS. 4 and 6 or in the floating p region 31 in FIG. 5 continue to exist until they diminish through the recombination process. These stored holes do not diminish even if the depleted electrons are read-out in the memory read-out process, so that the amount of electron depletion appears again in the n+ buried region even after one read-out process. In order to decrease the cycle time of image sensing, therefore, these stored holes are desired to be refreshed at each cycle time.

Figure 7A:
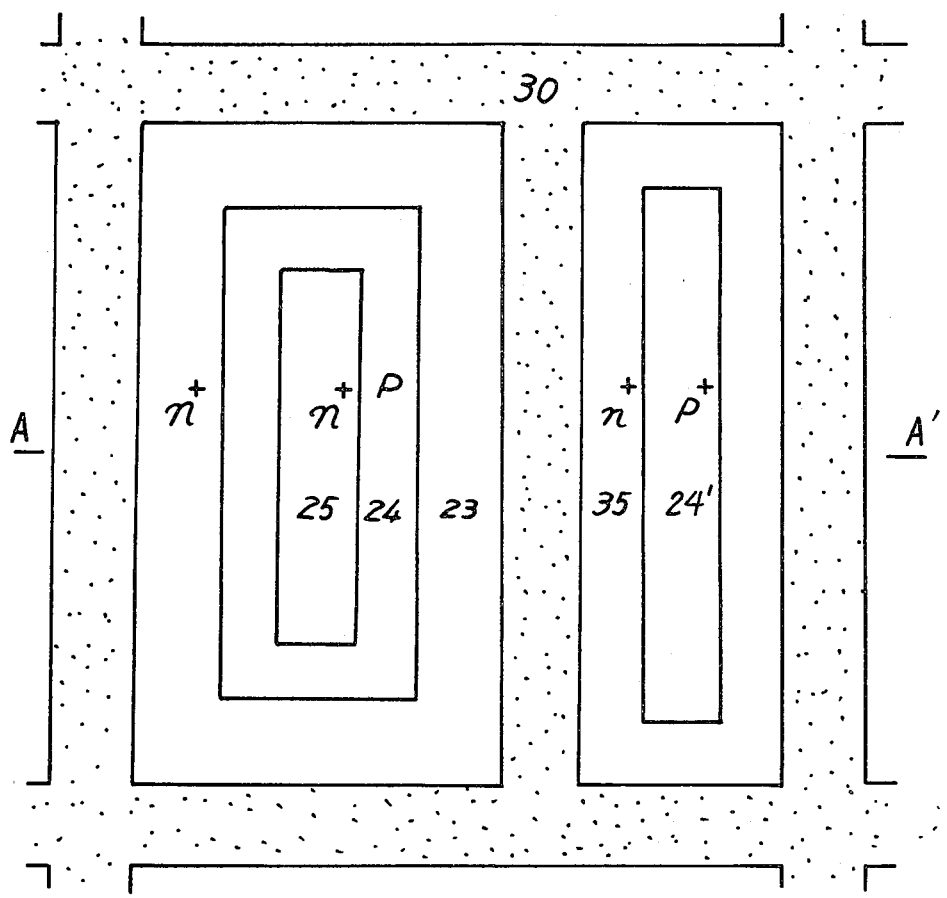
FIG. 7A shows a plan view of a portion of the other embodiment of the semiconductor image sensor according to the present invention.
Figure 7B:
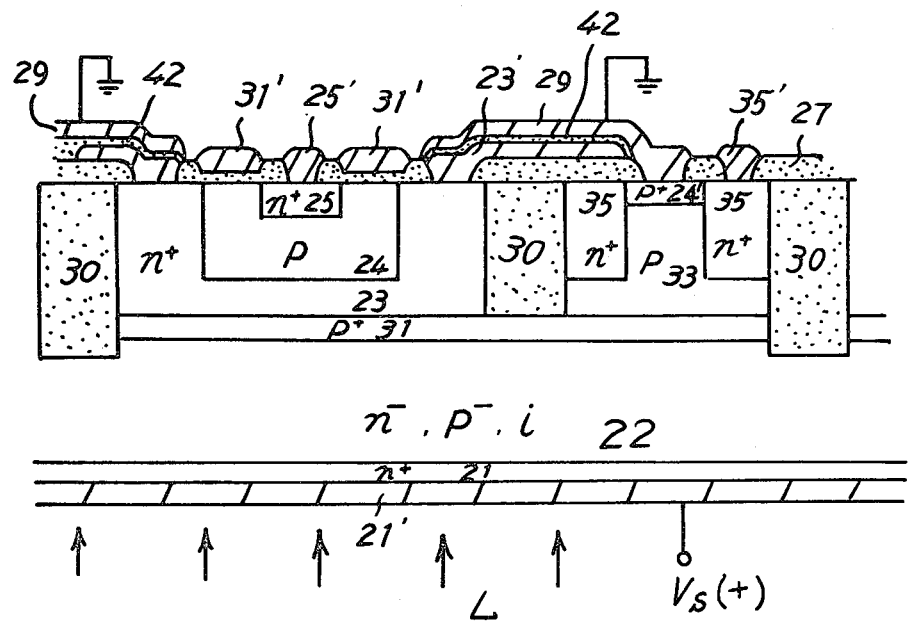
FIG. 7B shows a cross-sectional view of the semiconductor image sensor shown in FIG. 7A, taken along the section line A—A'.
Figure 7C:
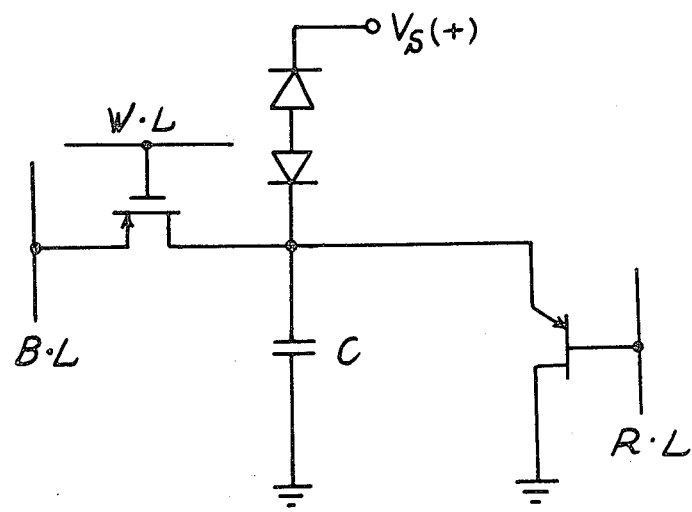
FIG. 7C shows a circuit diagram of the semiconductor image sensor shown in FIG. 7A.

Back illuminated image sensors of the present invention having switching transistor for refresh are illustrated in FIGS. 7A to 7C. This embodiment has two transistors in the unit cell, i.e., one is the memory read-out MOSFET or MOSSIT and another is the refresh junction SIT. Image sensing process is quite similar to that described in the previous embodiments, where the amount of holes in proportion to the optical input intensity is stored in the floating p+ layer 31, thus establishing the amount of electron depletion in the n+ buried region 23 which serves as the drain region of MOSFET or MOSSIT. In this embodiment, major storage capacitor comprises of an electrode 23', an insulating layer 42 and an electrode 29 as shown in FIG. 7B, so that the storage capacitor is quite large in this embodiment compared with the previous embodiments resulting in giving rise to large read-out voltage. The surface n+ region 25 surrounded by the p region 24 serves as the source region of the read-out MOSFET or MOSSIT. An electrode 31' serves as a gate electrode of the MOSFET or MOSSIT and also as a word line. In this embodiment a p-channel junction SIT is used as the refresh transistor for the stored holes. The p+ region 31, an p+ region 24' and n+ region 35 constitutes the p channel junction SIT, where a p region 33 serves as a channel region. A gate electrode 35' works for the refresh process. Certain positive bias voltage is usually applied on the n+ gate region 35 of junction SIT to keep the JSIT in the off-state. An application of negative pulse voltage on the n+ gate region turns on the JSIT to allow the stored holes flow out from the p+ floating region 31. Thus the refresh process is finished.

The image sensors shown in FIG. 7 are very excellent because the memory action is carried out in the carrier depletion storing mode and, moreover, the cycle time becomes short due to the existence of refresh transistor, although they inevitably accompany the tendancy to increase the cell area.

The image sensing process in these embodiments shown in FIGS. 4, 5 and 6, particularly in the embodiment shown in FIG. 7, is very sensitive to the optical input due to the existence of amplification process in hook structure as described below.

The basic concept of amplification process in the hook structure was introduced to explain the current amplification in the point contact transistor by Shockley in 1949.

The amplification process is analyzed for the n+p hook structure where n+ is the buried region and p is the floating region as shown in FIGS. 5A and 7B. The increase of excess hole concentration in the p floating region lowers the barrier height for electrons in the n+ buried region such as $V_{bi}-scqt/C_f$, where $V_{bi}$, s, c, $C_f$ and t are the built-in voltage between the n+ buried region and the p floating region, photon density of optical input signal, light velocity, capacitance of the p floating region and time, respectively. Optical input power per unit area is given by $sch\nu$ where h is Planck's constant and $\nu$ is optical frequency. Here, all created holes due to the optical irradiation are assumed to be stored in the p floating region and the hole transit time in the sensing region is assumed sufficiently short. Lowering of the barrier height induces flowing out of electrons from the n+ buried region towards the transparent electrode. The lack of electrond $\Delta n$ makes the n+ buried region positively biased such as $V(t)=q\Delta n/C_S$, where q and $C_S$ are unit charge and storage capacitance of the n+ buried region. Thus, the basic equation describing the variation of the potential of the n+ buried region is approximately given by $$\frac{dV(t)}{dt} = \frac{qn_sv_s}{C_s}\exp\left(-\frac{qV_{bi}}{KT}\right)\left\{\exp\left(\frac{q\left(\frac{scq}{C_f}t - V(t)\right)}{KT}\right) - 1\right\}, \quad (1)$$

where $n_s$, $v_s$, K and T are the electron concentration in the n+ buried region, the saturation velocity of electrons, Boltzmann's constant and temperature. Equation (1) is easily solved under the the initial condition of $V(t=0)=0$, such as $$V(+) = \frac{KT}{q} \ln \frac{\frac{sc}{C_f} e^{-(\frac{sc}{C_f} + \frac{\beta}{C_s})\frac{q^2 t}{KT}} + \frac{\beta}{C_s}}{\frac{\beta}{C_s}} + \frac{scq}{C_f} t, \quad (2)$$

where $\beta$ is given by $$\beta = n_s v_s \exp\left(-\frac{qV_{bi}}{KT}\right). \quad (3)$$

In the right hand side of eq. (2), the second term is much larger than the first term. Depleted electron number in the n+ buried region $\Delta n(t)$ is immediately derived from $C_s V(t)/q$. Therefore, the ratio of the depleted electron number to the input photon number is approximately expressed as $C_s/C_f$. The increase of the value of $C_s/C_f$ increases the sensitivity. The value of $C_s/C_f$ can be easily much higher than unity. This comes from the fact that the potential barrier lowering is very sensitive to the optical input if the value of $C_f$ is very small.

In case the avalanche multiplication is introduced to the optical sensing region, it is obvious that the sensitivity is multiplied by the multiplication factor.

Figure 8A:
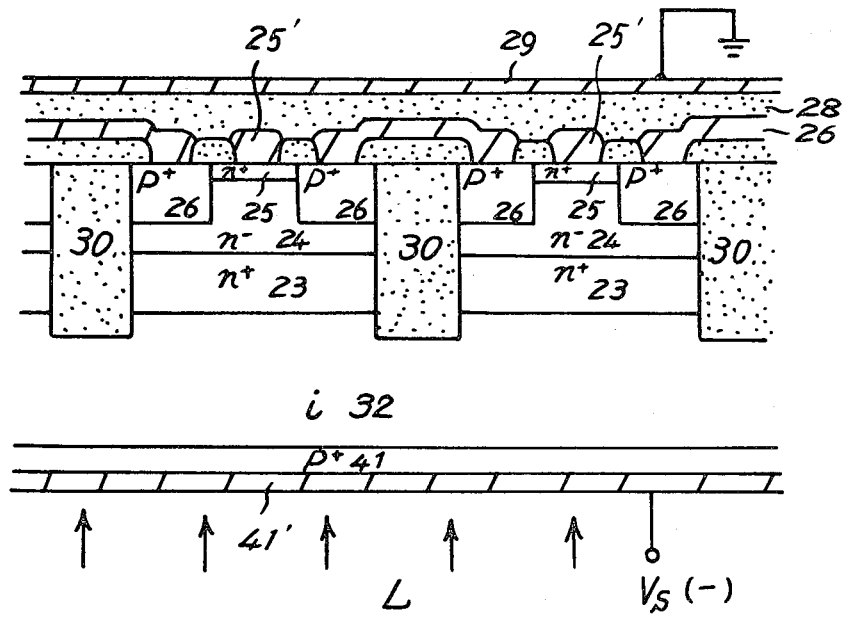
FIG. 8A shows a cross-sectional view of the other embodiment of the semiconductor image sensor according to the present invention.
Figure 8B:
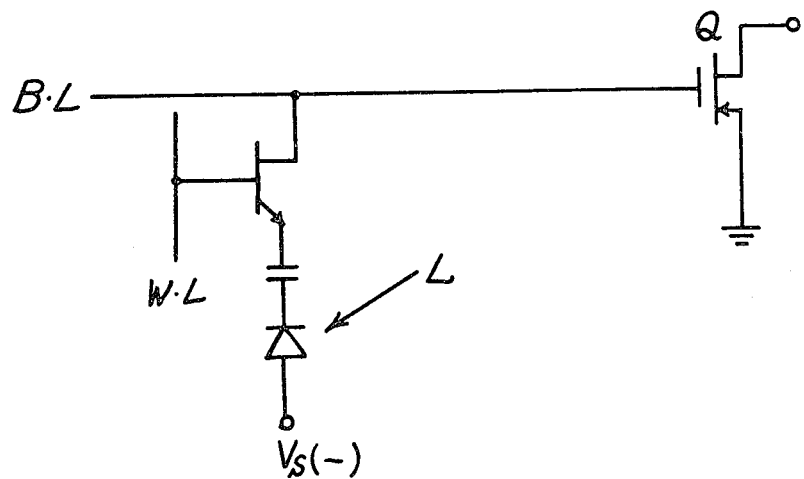
FIG. 8B shows a circuit diagram of the semiconductor image sensor shown in FIG. 8A.

FIG. 8A shows the back illuminated semiconductor image sensor of the present invention which operates in the carrier accumulation storing mode. The circuit diagram of this embodiment is shown in FIG. 8B. In this embodiment, the optical sensing region comprizes of p+(41)i(32)n+(23) structure and the transparent electrode is negatively biased such as $V_S(-)$, so that electrons created due to the optical irradiation flow into the n+ buried region 23. The amount of accumulated electrons is stored in the n+ buried region 23, which immediately vanishes in the read-out process. The cycle time can be made short in this embodiment.

The process sequence of the device shown in FIG. 5A is as follows: (1) substantially intrinsic substrate, (2) shallow diffusion or ion implantation of p region 31, (3) epitaxial growth of n+ buried region 23 (sheet resistance of 10 to 30 Ω/□, depth: about 1 μm), (4) epitaxial growth of n− layer 24 (impurity concentration: $5 \times 10^-$cm$^{-3}$, thickness: 2 μm), (5) high pressure oxidation for isolation region (depth: 3.5 μm), (6) p+ gate 26 diffusion or ion implantation of Boron (sheet resistance: 30 to 40 Ω/□, depth: 1.5 to 2 μm), (7) ion implantation of phosphors or arsenide for the surface n+ region 25 (implantation voltage: 150 kV, dose: $1 \times 10^{14}$ cm$^{-2}$), (8) thinning of back surface by plasma etching or wet bubble etching, (9) ion implantation of phosphors for the back surface n+ layer 21, (10) thermal annealing and (11) wiring for the word line and bit line, and transparent electrode such as In$_2$O$_3$, SnO$_2$, or low resistivity phlycrystaline silicon.

In these embodiments in FIGS. 4 and 6, the optical sensing region comprizes of the high resistivity region 22, in which the thickness l and the impurity concentration $N_A$ are chosen so as to satisfy the following condition, $$\frac{qN_A l^2}{2\epsilon} \geq V_S, \quad (4)$$

where $\epsilon$ is dielectric constant of semiconductor. For example, in case $V_S = 100$ V, $N_A = 1 \times 10^{13}$ cm$^{-3}$ and l=115 μm or in case $N_A = 1 \times 10^{14}$ cm$^{-3}$ and l=36 μm.

The present invention likewise is applicable for the case where the conductivity type is completely inverted. In order to realize a color selection, it is available to provide a multilayer filter comprising of SiO$_2$ and Si$_3$N$_4$ on the optical sensing region, i.e., the transparent electrode.

What is claimed is:

1. A semiconductor image sensor including a multiplicity of photo-sensor elements disposed in a matrix of rows and columns in a semiconductor body having first and second principal surfaces, each photo-sensor element comprising:
   a transistor comprising a first current terminal region including a first low resistivity semiconductor region of a first conductivity type disposed in said first principal surface, a second current terminal region including a second low resistivity semiconductor region of said first conductivity type disposed in said semiconductor body below and separated away from said first current terminal region, a current path region including a first high resistivity semiconductor region disposed between said first and second current terminal region, and a control terminal region disposed adjacent to said current path region, said second current terminal region being electrically floated;
   a third low resistivity semiconductor region of said first conductivity type disposed in said second principal surface; and
   a photo-sensing semiconductor region disposed between said second and third low resistivity semiconductor regions.

2. A semiconductor image sensor according to claim 1, wherein:
   said first high resistivity semiconductor region has said first conductivity type and said transistor is a unipolar transistor.

3. A semiconductor image sensor according to claim 1, wherein:
   said first high resistivity semiconductor region has said second conductivity type.

4. A semiconductor image sensor according to claim 1, wherein:
   said second high resistivity semiconductor region has a substantially intrinsic conductivity type.

5. A semiconductor image sensor according to claim 1, wherein:
   said second high resistivity semiconductor region has said first conductivity type.

6. A semiconductor image sensor according to claim 1, wherein:
   said second high resistivity semiconductor region has said second conductivity type.

7. A semiconductor image sensor according to claim 2, wherein:
   said first high resistivity semiconductor region has such a short length between said first and second low resistivity semiconductor regions, and such a low impurity concentration that said transistor constitutes a static induction transistor providing unsaturating I-V characteristics.

8. A semiconductor image sensor according to claim 1, further comprising:
a subsidiary current terminal region including a fourth low resistivity semiconductor region of said second conductivity type disposed in said first principal surface;
a third high resistivity semiconductor region disposed between said barrier semiconductor region and said subsidiary current terminal region; and
another control terminal region disposed adjacent to said third high resistivity semiconductor region.

9. A semiconductor image sensor according to claim 1, 2 or 3, comprising a second high resistivity semiconductor region (22) adjacent said third low resistivity region (21) and wherein a barrier semiconductor region (31) is disposed between said second high resistivity semiconductor region (22) and said second current terminal region (23), said barrier semiconductor region having a relatively low resistivity and a relatively thin thickness compared to said second high resistivity semiconductor region, said barrier semiconductor region being electrically floated.

10. A semiconductor image sensor including a multiplicity of photo-sensor elements disposed in a matrix of rows and columns in a semiconductor body having first and second principal surfaces, each photo-sensor element comprising:
a transistor comprising a first current terminal region including a first two resistivity semiconductor region (25) of a first conductivity type disposed in said first principal surface, a second current terminal region comprising a second low resistivity semiconductor region (23) of said first conductivity type disposed in said semiconductor body below and separated away from said first current terminal region, a current path region including a first high resistivity semiconductor region (24) disposed between said first and second low resistivity semiconductor regions, and a control terminal region (26 or 31) disposed adjacent to said current path region, said second current terminal region being electrically floated;
a third low resistivity semiconductor region (41) of a second conductivity type opposite to said first conductivity type disposed in said second principal surface;
a transparent electrode (41') disposed on said third low resistivity region, and
a photo-sensing high resistivity semiconductor region (22 or 32) disposed between said second and third low resistivity semiconductor regions.

* * * * *